US011835205B2

United States Patent
Ishigaki (10) Patent No.: US 11,835,205 B2
(45) Date of Patent: Dec. 5, 2023

(54) LIGHT SOURCE DEVICE, PROJECTOR, MACHINING DEVICE, LIGHT SOURCE UNIT, AND LIGHT SOURCE DEVICE ADJUSTING METHOD

(71) Applicant: Shimadzu Corporation, Kyoto (JP)

(72) Inventor: Naoya Ishigaki, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 17/918,286

(22) PCT Filed: Jan. 8, 2021

(86) PCT No.: PCT/JP2021/000550
§ 371 (c)(1),
(2) Date: Oct. 11, 2022

(87) PCT Pub. No.: WO2021/210226
PCT Pub. Date: Oct. 21, 2021

(65) Prior Publication Data
US 2023/0151952 A1    May 18, 2023

(30) Foreign Application Priority Data
Apr. 13, 2020 (JP) .................................. 2020-071469

(51) Int. Cl.
*H01S 5/40* (2006.01)
*F21V 19/00* (2006.01)
(Continued)

(52) U.S. Cl.
CPC .......... *F21V 19/003* (2013.01); *G02B 6/4204* (2013.01); *H01S 5/02208* (2013.01);
(Continued)

(58) Field of Classification Search
CPC . H01S 5/4025; H01S 5/02208; G02B 6/4204; F21V 19/003
(Continued)

(56) References Cited

U.S. PATENT DOCUMENTS

| 2011/0096543 A1 | 4/2011 | Yabe et al. |
| 2019/0186717 A1 | 6/2019 | Barrett et al. |

(Continued)

FOREIGN PATENT DOCUMENTS

| JP | 1993235479 | 10/1993 |
| JP | 2008299195 A | 12/2008 |

(Continued)

OTHER PUBLICATIONS

International Search Report and Written Opinion for PCT application No. PCT/JP2021/000550 dated Mar. 23, 2021.
Office Action issued for the corresponding Japanese application No. 2022-515205 dated Jul. 18, 2023.

*Primary Examiner* — Christopher M Raabe
(74) *Attorney, Agent, or Firm* — Muir Patent Law, PLLC (57) ABSTRACT

Provided is a light source device, a projector, a machining device, a light source unit, and a light source device adjusting method in which a replacement of a light source unit can be easily performed when required. The light source device 1 includes: a plurality of light source units 21 arranged in a two-dimensional array, each of the plurality of light source units having a plurality of light sources 21 and a support plate 22 supporting the plurality of light sources 21, each of the plurality of light sources 21 including a light emitting element for emitting a laser beam and a package housing the light emitting element; a base substrate 31 having a surface 311 on which the plurality of light source units 2 is arranged; and a fixing member 4 configured to detachably fix the support plate 22 to the base substrate 31.

12 Claims, 6 Drawing Sheets

(51) Int. Cl.
  *G02B 6/42* (2006.01)
  *H01S 5/02208* (2021.01)
  *F21Y 115/30* (2016.01)
  *G03B 21/20* (2006.01)
(52) U.S. Cl.
  CPC ......... *H01S 5/4025* (2013.01); *F21Y 2115/30* (2016.08); *G03B 21/2033* (2013.01)
(58) Field of Classification Search
  USPC ........................................................ 362/227
  See application file for complete search history.

(56) References Cited

U.S. PATENT DOCUMENTS

| | | | |
|---|---|---|---|
| 2020/0096852 A1* | 3/2020 | Wu | H01S 5/02208 |
| 2020/0169065 A1* | 5/2020 | Carson | H01S 5/18327 |
| 2022/0021180 A1* | 1/2022 | Cheng | H01S 5/0233 |

FOREIGN PATENT DOCUMENTS

| | | |
|---|---|---|
| JP | 2011096790 A | 5/2011 |
| JP | 2013251295 A | 12/2013 |
| JP | 2017085021 A | 5/2017 |
| JP | 2019110291 A | 7/2019 |
| WO | 2013133147 A1 | 9/2013 |

\* cited by examiner

LIGHT SOURCE DEVICE, PROJECTOR, MACHINING DEVICE, LIGHT SOURCE UNIT, AND LIGHT SOURCE DEVICE ADJUSTING METHOD

TECHNICAL FIELD

The present invention relates to a light source device, a projector, a machining device, a light source unit, and a light source device adjusting method.

BACKGROUND ART

A laser device for use in a laser processing machine, a lighting device, etc., is known (e.g., see Patent Document 1). The laser device described in Patent Document 1 is provided with a plurality of LD collimate units including a plurality of semiconductor laser beam sources, an LD holder to which the plurality of LD collimate units is fixed; and a heatsink for releasing the heat from the semiconductor laser beam sources.

PRIOR ART DOCUMENT

Patent Document

Patent Document 1: Japanese Unexamined Patent Application Publication No. 2017-085021

SUMMARY OF THE INVENTION

Problems to be Solved by the Invention

In the laser device described in Patent Document 1, each LD collimate unit is fixed to the LD holder by welding. Therefore, in a case where one of the semiconductor laser beam sources fails to properly operate and becomes unusable, the entire laser device must be replaced. For this result, there is a problem that the replacement work becomes large-scale.

An object of the present invention is to provide a light source device, a projector, a machining device, a light source unit, and a light source device adjusting method in which a light source unit can be easily replaced when the replacement is required.

Means for Solving the Problems

One aspect of the present invention relates to a light source device including:
  a plurality of light source units arranged in a two-dimensional array, each of the plurality of light source units having a plurality of light sources and a support plate supporting the plurality of light sources, each of the plurality of light sources including a light emitting element for emitting a laser beam and a package housing the light emitting element;
  a base substrate having a surface on which the plurality of light source units is arranged; and
  a fixing member configured to detachably fix the support plate to the base substrate.

One aspect of the present invention relates to a projector provided with the above-described light source device.

One aspect of the present invention relates to a machining device provided with the above-described light source device.

One aspect of the present invention relates to a light source unit including:
  a plurality of light sources each including a light emitting element for emitting a laser beam and a package housing the light emitting element; and
  a support plate configured to support the plurality of light sources,
  wherein the support plate has a through hole through which a fixing member for fixing the support plate passes.

One aspect of the present invention relates to a method of adjusting a light source device having a plurality of light source units, a base substrate, and optics, wherein each of the plurality of light source units is configured to emit a laser beam, the base substrate has a surface on which the plurality of light source units is arranged, the optics is configured to shape the laser beams emitted from the plurality of light source units, and the plurality of light source units each includes a plurality of light sources and a support plate for supporting the plurality of light sources,
  the method comprising:
  a step of removing the support plate from the base substrate to replace the light source unit.

Effects of the Invention

For example, when a failure, such as, e.g., a malfunction, has occurred in the light emitting element, there is a possibility that it becomes difficult or impossible to irradiate the target site with the laser beam. In such a case, it is necessary to replace the failed light source unit. According to the present invention, when replacing the light source unit, the replacement can be easily performed by a simple operation of operating the fixing member.

EMBODIMENTS FOR CARRYING OUT THE INVENTION

Referring to FIG. 1 to FIG. 6, an embodiment of a light source device, a projector, a machining device, a light source unit, and a light source device adjusting method according to the present invention will be described. Hereinafter, for the convenience of explanation, the right side in FIG. 1 and the lower side in FIG. 2 to FIG. 5 will be referred to as "optical axis direction upstream side (or left side)," and the left side in FIG. 1 and the upper side in FIG. 2 to FIG. 5 will be referred to as "optical axis direction downstream side (or right side)." In addition, the optical axis direction upstream side may be simply referred to as "upstream side," and the optical axis direction downstream side may be simply referred to as "downstream side." In FIG. 1 to FIG. 5, three axes orthogonal to each other are set to an X-axis, a Y-axis, and a Z-axis. For example, the X-Y plane including the X-axis and the Y-axis is parallel to a base substrate, and the Z-axis extends in the optical axis direction of the light emitting element.

Figure 1:
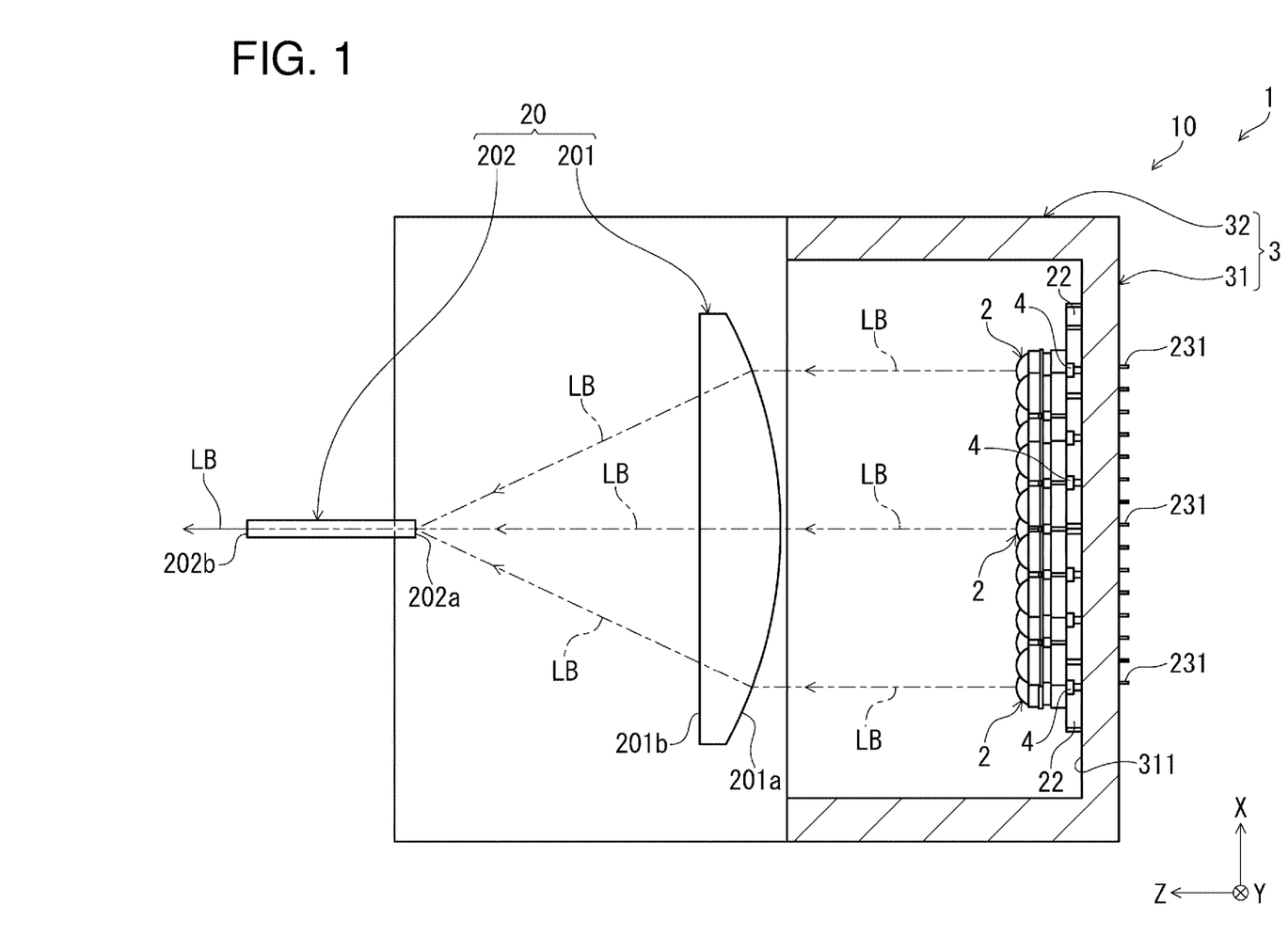
FIG. 1 is a schematic configuration diagram showing an embodiment of a light source device according to the present invention.

The light source device 1 shown in FIG. 1 is provided with a device body 10 and optics 20, which are arranged in this order from the optical axis direction upstream side toward the downstream side. As will be described later, the light source device 1 can be applied to, for example, a projector or a machining device. Hereinafter, the configuration of each part will be described.

The device body 10 is provided with a plurality of light source units 2, a housing 3 in which the plurality of light source units 2 is collectively stored and arranged, and fixing members 4 for fixing the light source units 2 to the housing 3.

Each light source unit 2 has the same configuration except that the arrangement position is different, and therefore, one light source unit 2 will be representatively described.

Figure 4:
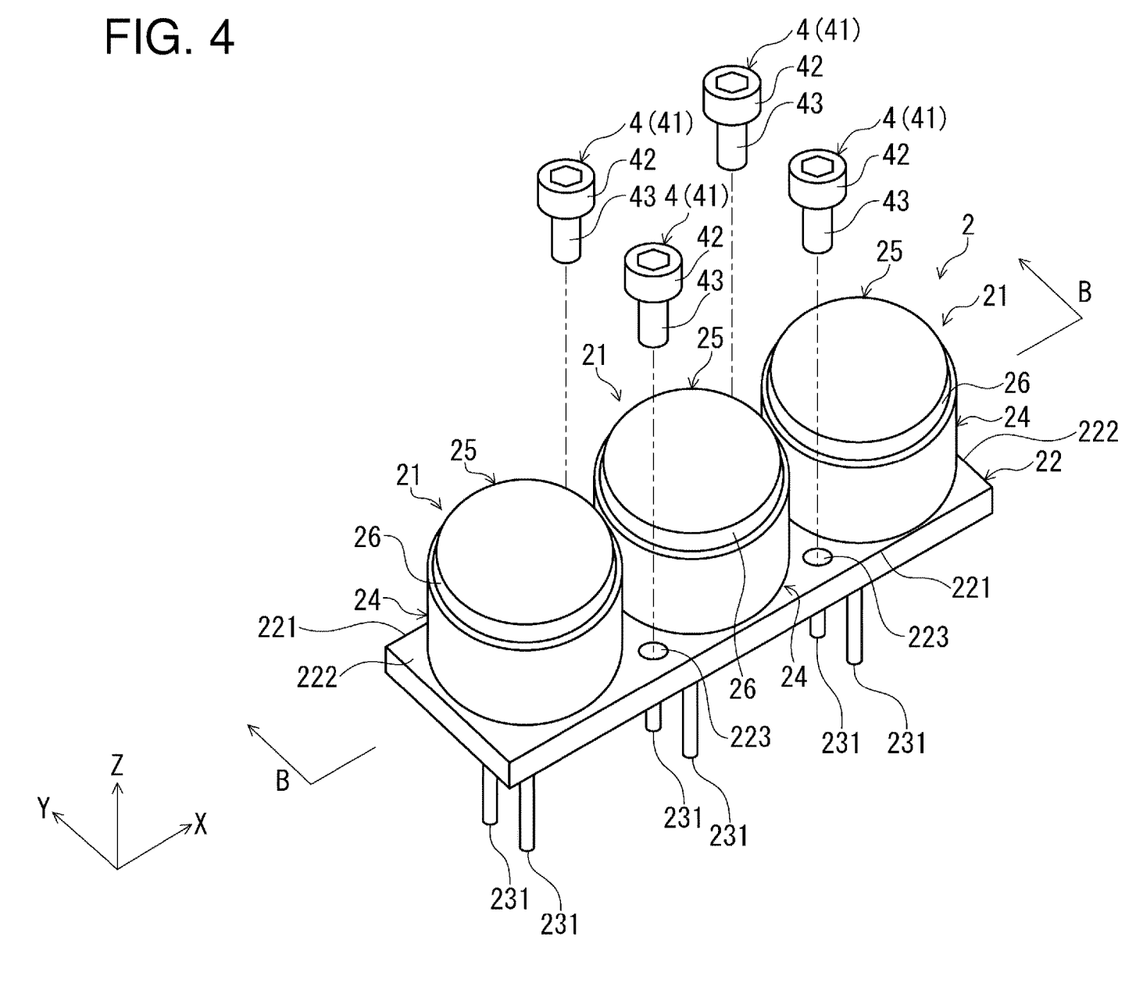
FIG. 4 is an enlarged view of the area [A] surrounded by the two-dot chain line in FIG. 3.

The light source unit 2 is configured to emit laser beams LBs. Specifically, as illustrated in FIG. 4 and FIG. 5, the light source unit 2 includes a plurality of light sources 21 and a support plate 22 that collectively supports the plurality of light sources 21.

Figure 5:
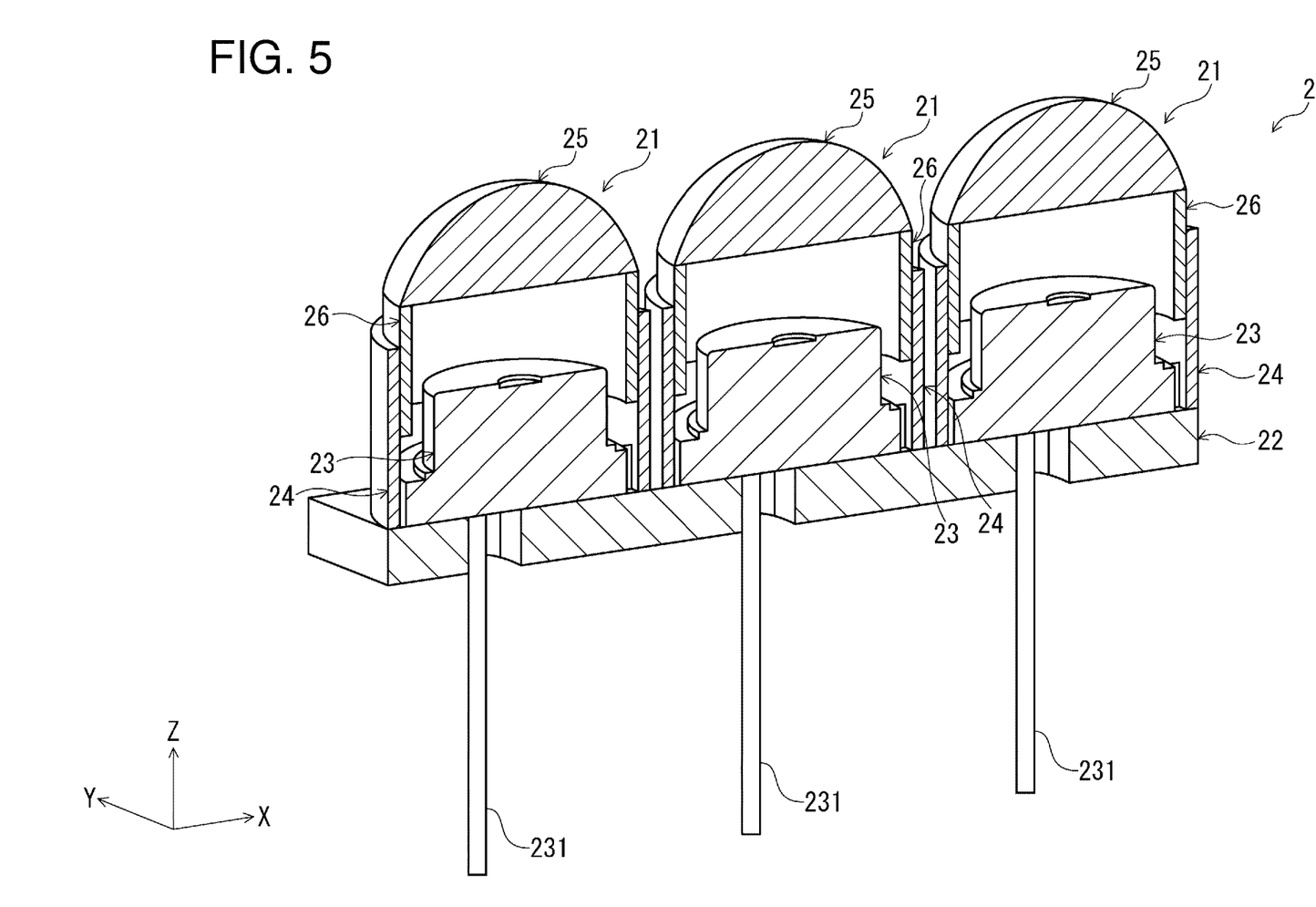
FIG. 5 is a cross-sectional view taken along the line B-B in FIG. 4.

As illustrated in FIG. 5, each light source 21 includes a light emitting element 23, a package 24, a collimator 25, and a connecting portion 26.

The light emitting element 23 includes, for example, a laser diode (LD) and can emit a laser beam LB. The light emitting element 23 has a terminal 231 configured to be electrically connected to an external power source or the like. The terminal 231 protrudes toward the Z-axis direction negative side.

The light emitting element 23 is housed in the package 24. The package 24 is a so-called CAN-type package and is formed in a cylindrical shape having a central axis parallel to the optical axis direction of the light emitting element 23 (light source 21). Such a package 24 contributes to, for example, a dense arrangement of the light sources 21 on the support plate 22, which will be described later.

A collimator 25 is arranged in the optical path of the light emitting element 23, i.e., arranged on the downstream side of the light emitting element 23. The collimator 25 is a lens that makes the laser beam LB parallel to the Z-axial direction. In the light source unit 2, the optical axis of the light emitting element 23 and the optical axis of the laser beam LB of the collimator 25 are adjusted to substantially coincide with each other such that the laser beam LB from each light emitting element 23 has a predetermined beam diameter. This adjustment is performed before housing the light source unit 2 in the housing 3.

The connecting portion 26 is a member for connecting the package 24 and the collimator 25. The connecting portion 26 has a cylindrical shape and is arranged inside the package 24 concentrically with the package 24.

Figure 2:
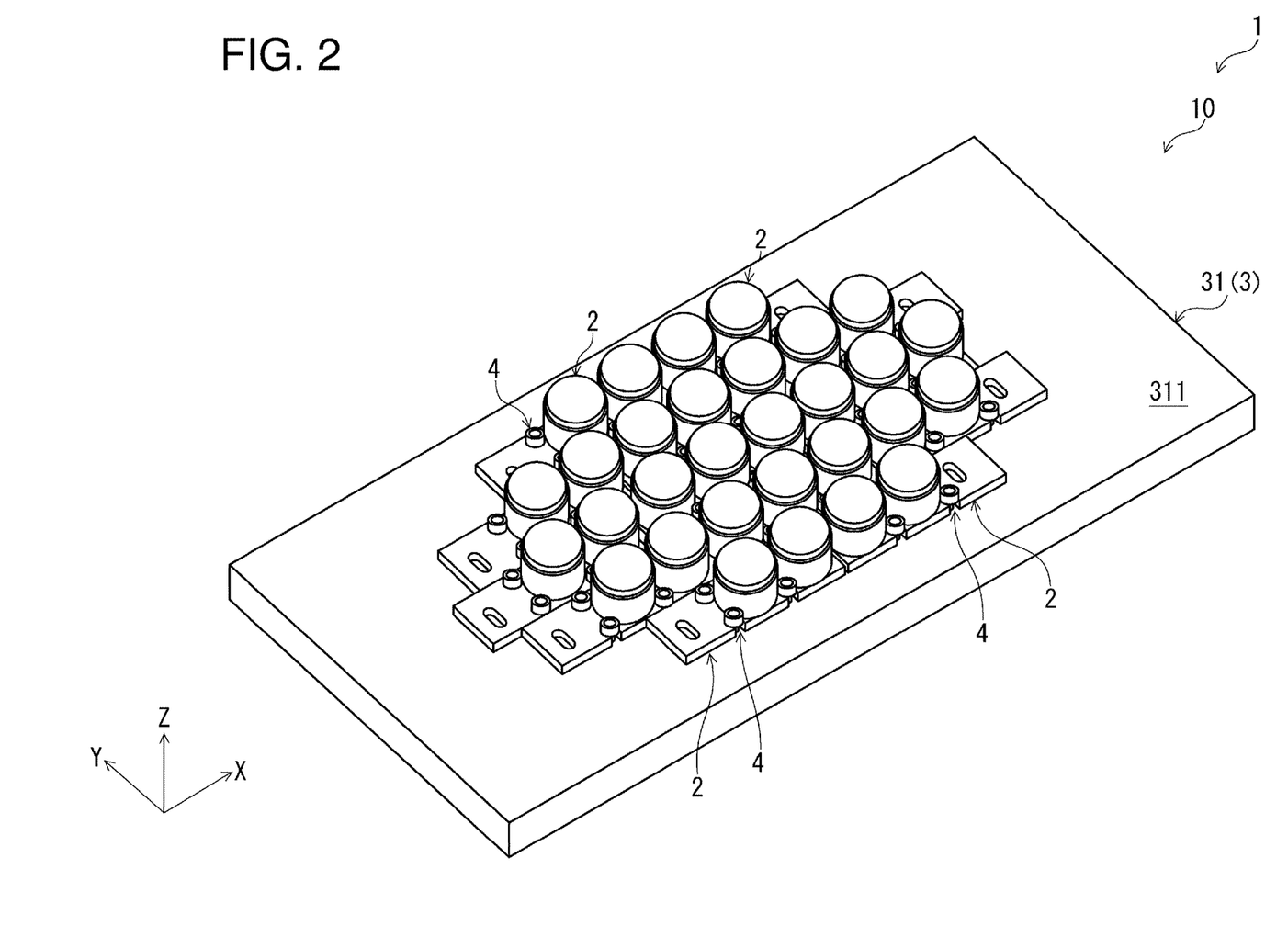
FIG. 2 is a perspective view of a main part of the light source device shown in FIG. 1.
Figure 3:
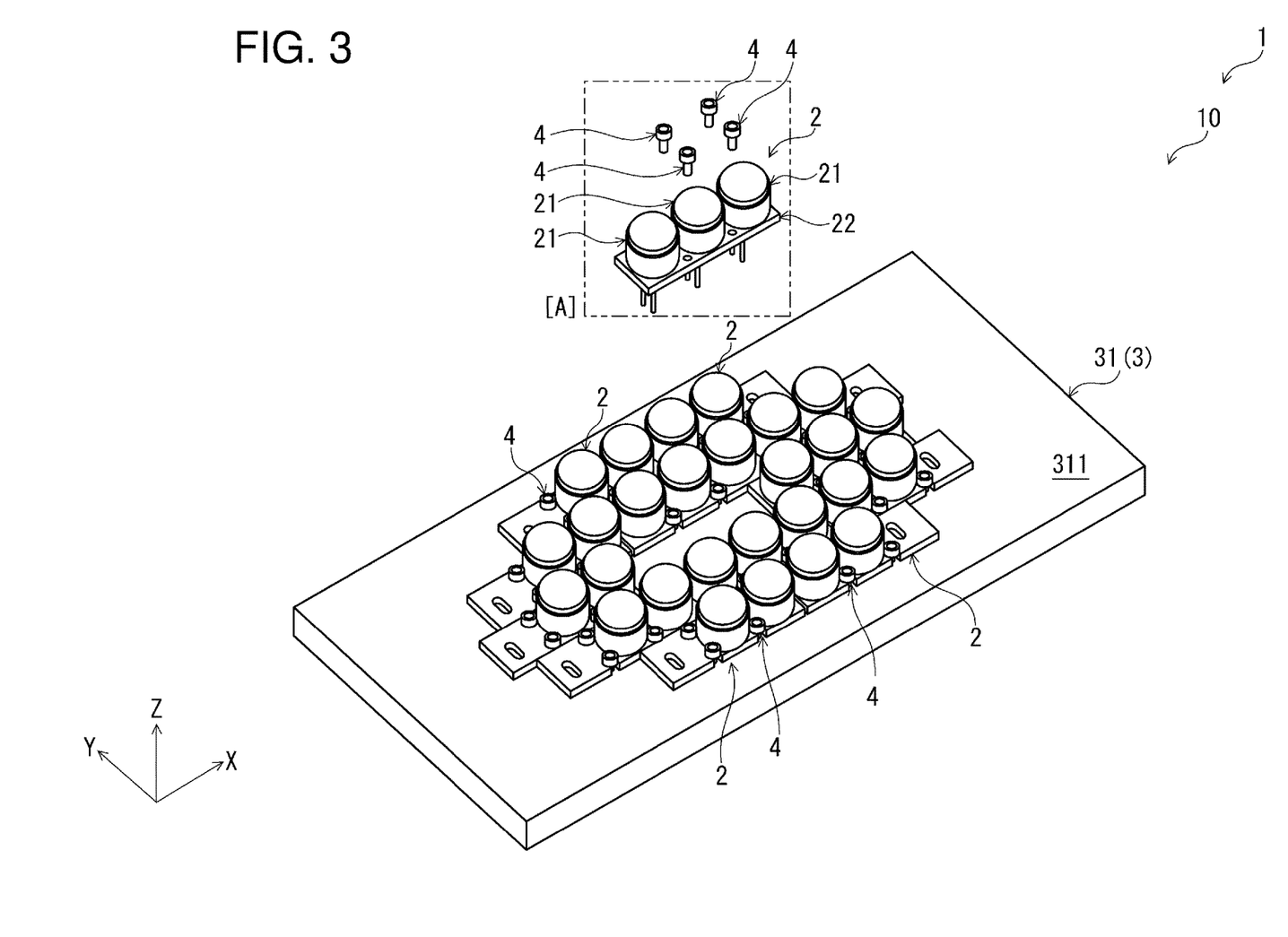
FIG. 3 is an exploded perspective view of the main part of the light source device shown in FIG. 1.

As shown in FIG. 3 and FIG. 4, three light sources 21 are supported on the support plate 22. As shown in FIG. 1 and FIG. 2, there is a case in which the arrangement number of the light sources 21 supported by the support plate 22 is two as shown in FIG. 1 and FIG. 2, in addition to the case in which the number is three. Note that the arrangement number of the light sources 21 supported by the support plate 22 is not limited to two or three and may be four or more, depending on various conditions, such as, e.g., the size of the support plate 22 and the size of the light source 21.

When viewed in the optical axis direction, i.e., viewed from the Z-axis positive side, the support plate 22 is formed in a rectangular shape, particularly in this embodiment, a rectangular shape having a pair of long sides 221 and a pair of short sides 222. Note that each long side 221 is parallel to the X-axis direction, and each short side 222 is parallel to the Y-axis direction.

When viewed from the optical axis direction, on the support plate 22, all of the light sources 21 are closely packed along the pair of long sides 221 which are two parallel sides of the support plate 22. With this configuration, it is possible to reduce the size of the light source unit 2 while increasing the number of the light sources 21 per one sheet of the support plate 22 as much as possible. In addition, the miniaturized light source unit 2 is large enough to be easily gripped. Thus, for example, the replacement work of the light source unit 2 with respect to the base substrate 31 of the housing 3 can be easily performed.

The support plate 22 is made of a metal material. This allows the heat generated when the light emitting element 23 emits the laser beam LB to be released to the base substrate 31 via the support plate 22. Thus, the light source unit 2 is excellent in heat dissipation. The metal material constituting the support plate 22 is not particularly limited, and for example, a metal material having a relatively high thermal conductivity, such as, e.g., aluminum and copper, can be used.

Note that the support plate 22 is preferably configured to be capable of adjusting the position of the collimator 25 with respect to the light emitting element 23. This makes it possible to adjust the emission angle of the collimated light emitted from the collimator 25.

As shown in FIG. 1, the housing 3 includes a base substrate 31 and a side wall 32.

The base substrate 31 is formed in a flat plate shape, and the thickness direction thereof is arranged in parallel to the Z-axis direction. With this, the base substrate 31 has a surface 311 facing the Z-axis positive side. A plurality of light source units 2 is arranged on the surface 311 in a two-dimensional array. Further, the adjacent light source units 2 are arranged in close contact with each other on the base substrate 31. Further, all of the light sources 21 on the base substrate 31 are arranged in a honeycomb-like manner (that is, in a dense hexagonal manner). With this placement (arrangement), the light source device 1 is served as a high-power laser beam irradiator.

Note that the support plate 22 is thinner than the base substrate 31. Thereby, the heat from the light emitting element 23 is rapidly transferred to the base substrate 31 via the support plate 22. Therefore, rapid heat dissipation can be performed.

The side wall 32 is formed to protrude from the edge portion of the base substrate 31 in the Z-axial direction. When viewed in the optical axis direction, i.e., when viewed from the Z-axis direction positive side, the side wall 32 surrounds the plurality of light source units 2.

As shown in FIG. 2 and FIG. 3, the support plate 22 of the light source unit 2 is detachably fixed to the base substrate 31 by fixing members 4. As shown in FIG. 4, the fixing member 4 is a fastening member. In this embodiment, the fixing member 4 is a hexagon socket head bolt (hereinafter simply referred to as "bolt") 41. The bolt 41 has a head (screw head) 42 and a threaded portion (male threaded portion) 43.

Further, the support plate 22 has a through hole 223 through which the fixing member 4, i.e., the male threaded portion 43 of the bolt 41, passes. Then, the threaded portion 43 of the bolt 41 can be threaded into a female threaded portion (not shown) of the base substrate 31 with the threaded portion 43 passed through the through hole 223. With this, the light source unit 2 can be fixed to the base substrate 31. Further, by loosening the bolt 41, the threaded engagement between the male threaded portion 43 of the bolt 41 and the female threaded portion of the base substrate 31 are released. With this, the light source unit 2 can be detached from the base substrate 31. Note that the operation of fastening and loosening the bolt 41 can be easily performed by using, for example, a hexagonal wrench.

As shown in FIG. 4, four bolts 41 are each arranged at the interspace between the adjacent light sources 21 so as not to interfere with the light sources 21. With this, the light source unit 2 can be firmly fixed to the base substrate 31 in a stable manner with the light sources 21 closely packed. Note that the number of arrangements (the number of uses) of the bolts 41 is not limited to four and may be two, three, five, or more, depending on, for example, the size of the support plate 22 or the like.

The optics 20 can shape each laser beam LB emitted from each light source unit 2. As shown in FIG. 1, the optics 20 is provided with a converging lens 201 and an optical fiber 202.

The converging lens 201 is arranged on the outer side of the housing 3 and the downstream side of each collimator 25. The converging lens 201 is a lens that converges each laser beam LB toward the optical fiber 202. The converging lens 201 has a light incidence surface 201*a* on which the laser beam LB is incident and a light emission surface 201*b* from which the laser beam LB emits. The light incidence surface 201*a* is configured by a curved convex surface. The light emission surface 201*b* is configured by a flat surface.

The optical fiber 202 is arranged on the optical path of the laser beam LB on the downstream side of the converging lens 201. The optical fiber 202 has an elongated shape and has an upstream end face serving a light incidence surface 202*a* and a downstream end face serving a light emission surface 202*b*. The laser beams LB converged by the converging lens 201 are collectively incident on the light incidence surface 202*a*. The laser beams LBs pass through the optical fiber 202 to the light emission surface 202*b* and exit from the light emission surface 202*b*. The optical fiber 202 is not particularly limited. For example, an optical fiber, an optical waveguide, or the like can be used.

For example, in a case where a failure, such as, e.g., a malfunction, has occurred in the light emitting element 23 or the collimator 25, there is a possibility that it becomes difficult or impossible for the laser beam LB to enter into the optical fiber 202. In such a case, it is necessary to replace the defective light source unit 2. When replacing the light source unit 2, the light source unit 2 can be easily removed (detached) from the housing 3 with a simple operation of loosing and detaching the bolts 41.

Then, a new, i.e., unused, light source unit 2 can be attached to (mounted on) the position of the defective light source unit 2. This unused light source unit 2 is fixed to the housing 3 in the same condition as the defective light source unit 2. As a result, the position adjustment and the like for the light source unit 2 after the replacement can be omitted, and the reproducibility of the fixed condition is improved. Therefore, after the replacement of the light source unit 2, the use of the light source device 1 can be resumed quickly. Note that the attachment of the unused light source unit 2 can be easily performed by a simple operation of tightening the bolts 41 as described above.

With the above-described attachment and detachment configuration, the replacement operation can be performed more easily and quickly as compared with the case in which the light emitting element 23 or the collimator 25, that is, the light source 21, is replaced one by one.

The light source device 1 as described above can be applied to, for example, a projector or a machining device. Next, some application examples of the light source device 1 will be described.

Application Example 1

The light source device 1 can be applied to a projector for projecting an image or the like onto a screen. The projector is provided with the light source device 1. In this case, the light source device 1 is configured to emit red, green, and blue laser beams LBs different in wavelength. As a result, the light source device 1 can project a color image.

Application Example 2

The light source device 1 can be applied to a machining device for performing laser processing. The machining device is provided with the light source device 1. In this case, the light source device 1 is configured to emit, for example, blue laser beams LBs different in wavelength from each other. Thus, the light source device 1 can perform, for example, laser processing.

Figure 6:
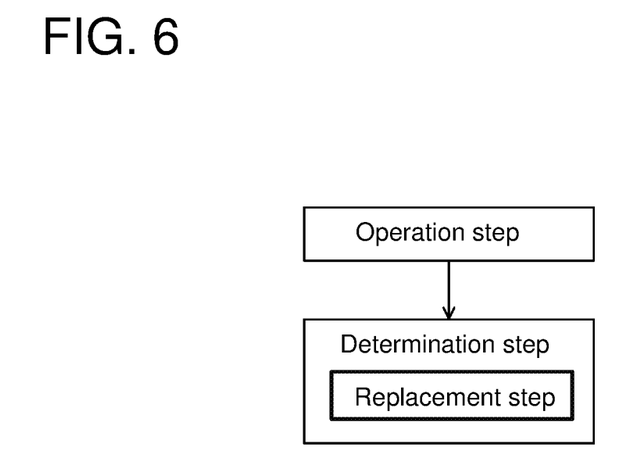
FIG. 6 is a diagram showing each step in a light source device adjusting method according to the present invention in order.

Next, a method of adjusting the light source device 1 will be described. The adjustment of the light source device 1 is performed, for example, when a failure has occurred in the light source device 1.

As shown in FIG. 6, the adjustment method includes an operation step and a determination step, and these steps are sequentially performed.

The operation step is a step of activating the light source device 1 to use it.

The determination step is a step of determining the failure or the deterioration of the light source unit 2. The determination method is not particularly limited, and examples thereof include a method based on the decrease in brightness of the light source unit 2, the elapsed time after the replacement of the light source unit 2, and the like. In addition, when it is determined that a failure or deterioration has occurred in the light source unit 2, it is preferable to notify the fact by, for example, a voice (alarm) or the like. This makes it possible to prompt the replacement of the light source unit 2.

The determination step includes a replacement step of replacing the light source unit 2 when it is determined that a failure or deterioration has occurred in the light source unit 2. In the replacement step, the support plate 22 is removed from the base substrate 31 as described above, thereby replacing the light source unit 2. Therefore, the light source unit 2 that needs to be replaced is determined by this adjustment step, and the determined light source unit 2 can be replaced.

Although the light source device, the projector, the machining device, the light source unit, and the light source device adjusting method according to the present invention have been described with reference to the illustrated embodiments, the present invention is not limited thereto. Each part constituting the light source device, the projector, the machining device, and the light source unit can be replaced with any component capable of performing the same function. Further note that any optional component may also be added.

[Aspects]

It will be understood by those skilled in the art that the plurality of exemplary embodiments described above is illustrative of the following aspects.

(Item 1)

A light source device according to the present invention is provided with:
- a plurality of light source units arranged in a two-dimensional array, each of the plurality of light source units having a plurality of light sources and a support plate supporting the plurality of light sources, each of the plurality of light sources including a light emitting element for emitting a laser beam and a package housing the light emitting element;
- a base substrate having a surface on which the plurality of light source units is arranged; and
- a fixing member configured to detachably fix the support plate to the base substrate.

For example, when a failure, such as, a malfunction, has occurred in the light emitting element, there is a possibility that it becomes difficult or impossible to irradiate the target site with the laser beam. In such a case, it is necessary to replace the light source unit in which a failure has occurred. According to the light source device described in the above-described Item 1, when replacing the light source unit, the replacement can be easily performed by a simple operation of operating the fixing member.

(Item 2)

In the light source device as recited in the above-described Item 1,
- the plurality of light source units is arranged on the base substrate in close contact with each other, and
- all of the plurality of light sources are closely packed when viewed from an optical axis direction of the light source.

According to the light source device as recited in the above-described Item 2, it is possible to reduce the size of the light source unit while increasing the number of the light sources per one sheet of the support plate as much as possible.

(Item 3)

In the light source device as recited in the above-described Item 1 or 2,
- the support plate is rectangular when viewed from an optical axis direction of the light source, and
- the plurality of light sources is closely packed along two parallel sides of the support plate.

According to the light source device as recited in the above-described Item 3, the light source unit is large enough to be easily gripped, and therefore, for example, the light source unit can be easily replaced with respect to the base substrate.

(Item 4)

In the light source device as recited in the above-described Item 3,
- the fixing member is a fastening member arranged between the two of the light sources adjacent to each other.

According to the light source device as recited in the above-described Item 4, in a case where, for example, a bolt is used as the fastening member, the support plate can be easily attached to and detached from the base substrate.

(Item 5)

In the light source device as recited in any one of the above-described Items 1 to 4,
- the support plate is thinner than the base substrate.

According to the light source device as recited in the above-described Item 5, the heat from the light emitting element is rapidly transferred to the base substrate via the support plate. Therefore, rapid heat dissipation can be achieved.

(Item 6)

In the light source device as recited in any one of the above-described Items 1 to 5,
- the support plate is made of a metal material.

According to the light source device as recited in the above-described Item 6, the heat generated when the light emitting element emits the laser beam can be released to the base substrate via the support plate. Thus, the light source unit is excellent in heat dissipation.

(Item 7)

In the light source device as recited in any one of the above-described Items 1 to 6,
- the package is a CAN-type package.

The light source device as recited in the above-described Item 7 can contribute to, for example, a dense arrangement of the light sources on the support plate.

(Item 8)

The light source device as recited in any one of the above-described Items 1 to 7, further comprising:
- a collimator arranged in an optical path of the light emitting element.

According to the light source device as recited in the above-described Item 8, a laser beam can be collimated, and the laser beam can be sufficiently emitted forward.

(Item 9)

The light source device as recited in the above-described Item 8, further includes:
- a converging lens arranged on an optical axis direction downstream side with respect to the collimator, the converging lens being configured to converge the laser beams; and
- an optical fiber arranged on an optical axis direction downstream side with respect to the converging lens, the optical fiber being configured to guide the laser beams converged by the converging lens and emit the laser beams.

According to the light source device as recited in the above-described Item 9, the light source device can be applied to, for example, a projector or a machining device.

(Item 10)

A projector according to one aspect of the present invention is provided with:
- the light source device as recited in any one of the above-described Items 1 to 9.

For example, when a failure, such as, e.g., a malfunction, has occurred in the light emitting element, there is a possibility that it becomes difficult or impossible to irradiate the target site with the laser beam. In such a case, it is necessary to replace the light source unit in which a failure has occurred. According to the projector as recited in the above-described Item 10, when replacing the light source unit, the replacement can be easily performed by a simple operation of operating the fixing member.

(Item 11)

A machining device according to one aspect of the present invention is provided with:
- the light source device as recited in any one of the above-described Items 1 to 9.

For example, when a failure, such as, a malfunction, has occurred in the light emitting element, there is a possibility that it becomes difficult or impossible to irradiate the target site with the laser beam. In such a case, it is necessary to replace the light source unit in which a failure has occurred. According to the machining device as recited in the above-described Item 11, when replacing the light source unit, the replacement can be easily performed by a simple operation of operating the fixing member.

(Item 12)

A light source unit according to one aspect of the present invention is provided with:
 a plurality of light sources each including a light emitting element for emitting a laser beam and a package housing the light emitting element; and
 a support plate configured to support the plurality of light sources,
 wherein the support plate has a through hole through which a fixing member for fixing the support plate passes.

For example, when a failure, such as, e.g., a malfunction, has occurred in the light emitting element, there is a possibility that it becomes difficult or impossible to irradiate the target site with the laser beam. In such a case, it is necessary to replace the light source unit that has failed. According to the light source device as recited in the above-described Item 12, when replacing the light source unit, the replacement can be easily performed by a simple operation of operating the fixing member.

(Item 13)

A light source device adjusting method according to one aspect of the present invention relates to a method of adjusting a light source device having a plurality of light source units, a base substrate, and optics, wherein each of the plurality of light source units is configured to emit a laser beam, the base substrate has a surface on which the plurality of light source units is arranged, the optics is configured to shape the laser beams emitted from the plurality of light source units, and the plurality of light source units each includes a plurality of light sources and a support plate for supporting the plurality of light sources,
 the method comprising:
 a step of removing the support plate from the base substrate to replace the light source unit.

For example, when a failure, such as, e.g., a malfunction, has occurred in the light emitting element, there is a possibility that it becomes difficult or impossible to irradiate the target site with the laser beam. In such a case, it is necessary to replace the light source unit in which a failure has occurred. According to the light source device adjusting method as recited in the above-described Item 13, when replacing the light source unit, the replacement can be easily performed by a simple operation of removing the support plate from the base substrate.

(Item 14)

In the light source device adjusting method as recited in the above-described Item 13, the method further includes:
 a step of determining a failure or deterioration of the light source unit,
 wherein the step of determining the failure or the deterioration of the light source includes a step of replacing the light source unit when it is determined that the light source unit has failed or deteriorated.

According to the light source device adjusting method as recited in the above-described Item 14, the light source unit can be replaced without waste.

DESCRIPTION OF SYMBOLS

1: Light source device
2: Light source unit
 21: Light source
 22: Support plate
 221: Long side
 222: Short side
 223: Through hole
 23: Light emitting element
 231: Terminal
 24: Package
 25: Collimator
 26: Connecting portion
3: Housing
 31: Base substrate
 311: Surface
 32: Side wall
4: Fixing member
 41: Hexagon socket head bolt (bolt)
 42: Head (screw head)
 43: Threaded portion (male threaded portion)
10: Device body
20: Optics
 201: Converging lens
 201a: Light incidence surface
 201b: Light emission surface
 202: Optical fiber
 202a: Light incidence surface
 202b: Light emission surface
LB: Laser beam

The invention claimed is:

1. A light source device comprising:
 a plurality of light source units arranged in a two-dimensional array, each of the plurality of light source units having a plurality of light sources and a support plate supporting the plurality of light sources, each of the plurality of light sources including a light emitting element for emitting a laser beam and a package housing the light emitting element;
 a base substrate having a surface on which the plurality of light source units is arranged; and
 a fixing member configured to detachably fix the support plate to the base substrate,
 wherein the support plate is rectangular when viewed from an optical axis direction of the light source portion, and
 wherein the plurality of light sources is closely packed along two parallel sides of the support plate.

2. A light source device comprising:
 a plurality of light source units arranged in a two-dimensional array, each of the plurality of light source units having a plurality of light sources and a support plate supporting the plurality of light sources, each of the plurality of light sources including a light emitting element for emitting a laser beam and a package housing the light emitting element;
 a base substrate having a surface on which the plurality of light source units is arranged; and
 a fixing member configured to detachably fix the support plate to the base substrate,
 wherein all of the plurality of light sources are closely packed on a same plane.

3. The light source device as recited in claim 1,
 wherein the fixing member is a fastening member arranged between the two of the light sources adjacent to each other.

4. The light source device as recited in claim 1,
wherein the support plate is thinner than the base substrate.

5. The light source device as recited in claim 1,
wherein the support plate is made of a metal material.

6. The light source device as recited in claim 1,
wherein the package is a CAN-type package.

7. The light source device as recited in claim 1, further comprising:
a collimator arranged in an optical path of the light emitting element.

8. The light source device as recited in claim 7, further comprising:
a converging lens arranged on an optical axis direction downstream side with respect to the collimator, the converging lens being configured to converge the laser beams; and
an optical fiber arranged on an optical axis direction downstream side with respect to the converging lens, the optical fiber being configured to guide the laser beams converged by the converging lens and emit the laser beams.

9. A projector comprising:
the light source device as recited in claim 1.

10. A machining device comprising:
the light source device as recited in claim 1.

11. A method of adjusting a light source device having a plurality of light source units, a base substrate, and optics, wherein each of the plurality of light source units is configured to emit a laser beam, the base substrate has a surface on which the plurality of light source units is arranged, the optics is configured to shape the laser beams emitted from the plurality of light source units, and the plurality of light source units each includes a plurality of light sources and a support plate for supporting the plurality of light sources,
the method comprising:
a step of removing the support plate from the base substrate to replace the light source unit.

12. The method of adjusting the light source device as recited in claim 11, further comprising:
a step of determining a failure or deterioration of the light source unit,
wherein the step of determining the failure or the deterioration of the light source includes a step of replacing the light source unit when it is determined that the light source unit has failed or deteriorated.

* * * * *